(12) United States Patent
Anderson et al.

(10) Patent No.: US 7,888,780 B2
(45) Date of Patent: Feb. 15, 2011

(54) SEMICONDUCTOR STRUCTURES INCORPORATING MULTIPLE CRYSTALLOGRAPHIC PLANES AND METHODS FOR FABRICATION THEREOF

(75) Inventors: Brent A. Anderson, Jericho, VT (US); Edward J. Nowak, Essex Junction, VT (US); Jed H. Rankin, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/688,470

(22) Filed: Jan. 15, 2010

(65) Prior Publication Data

US 2010/0117125 A1 May 13, 2010

Related U.S. Application Data

(62) Division of application No. 11/556,833, filed on Nov. 6, 2006, now Pat. No. 7,649,243.

(51) Int. Cl.
*H01L 29/04* (2006.01)

(52) U.S. Cl. .................. 257/627; 257/64; 257/E33.003; 257/E29.002; 257/E21.036; 257/E21.233; 257/628; 257/E31.04; 257/E29.003; 257/E29.004; 257/255

(58) Field of Classification Search .................. 257/255
See application file for complete search history.

(56) References Cited

U.S. PATENT DOCUMENTS

| | | | |
|---|---|---|---|
| 5,072,276 A | 12/1991 | Malhi et al. | |
| 6,483,171 B1 | 11/2002 | Forbes et al. | |
| 6,657,259 B2 | 12/2003 | Fried et al. | |
| 6,670,694 B2 * | 12/2003 | Momose | 257/627 |
| 6,815,277 B2 | 11/2004 | Fried et al. | |
| 6,867,460 B1 | 3/2005 | Anderson et al. | |
| 6,911,383 B2 | 6/2005 | Doris et al. | |
| 6,919,251 B2 | 7/2005 | Rotondaro et al. | |
| 2002/0185676 A1 | 12/2002 | Momose | |

FOREIGN PATENT DOCUMENTS

JP 63080561 A 4/1988

* cited by examiner

*Primary Examiner*—Sue Purvis
*Assistant Examiner*—Fei Fei Yeung Lopez
(74) *Attorney, Agent, or Firm*—Scully, Scott, Murphy & Presser, P.C.; Anthony J. Canale

(57) ABSTRACT

A semiconductor structure includes a semiconductor mesa located upon an isolating substrate. The semiconductor mesa includes a first end that includes a first doped region separated from a second end that includes a second doped region by an isolating region interposed therebetween. The first doped region and the second doped region are of different polarity. The semiconductor structure also includes a channel stop dielectric layer located upon a horizontal surface of the semiconductor mesa over the second doped region. The semiconductor structure also includes a first device located using a sidewall and a top surface of the first end as a channel region, and a second device located using the sidewall and not the top surface of the second end as a channel. A related method derives from the foregoing semiconductor structure. Also included is a semiconductor circuit that includes the semiconductor structure.

15 Claims, 7 Drawing Sheets

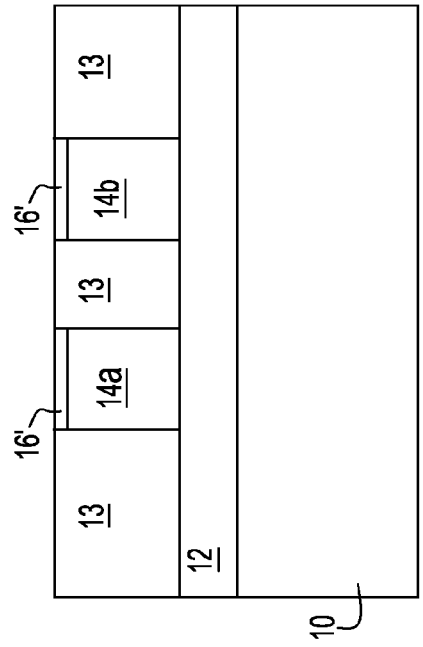
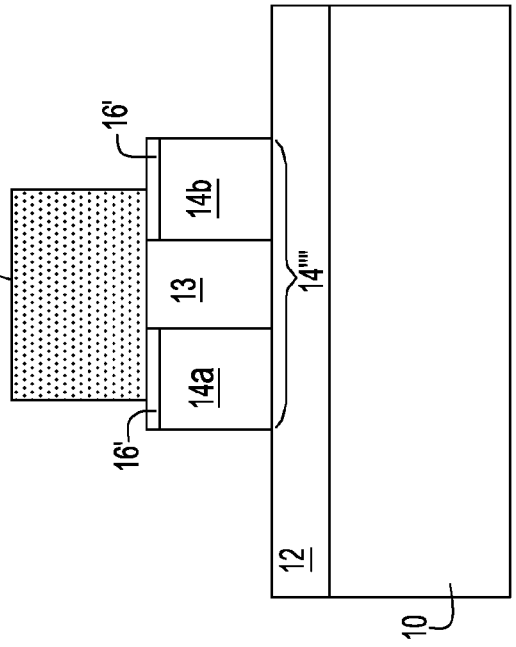
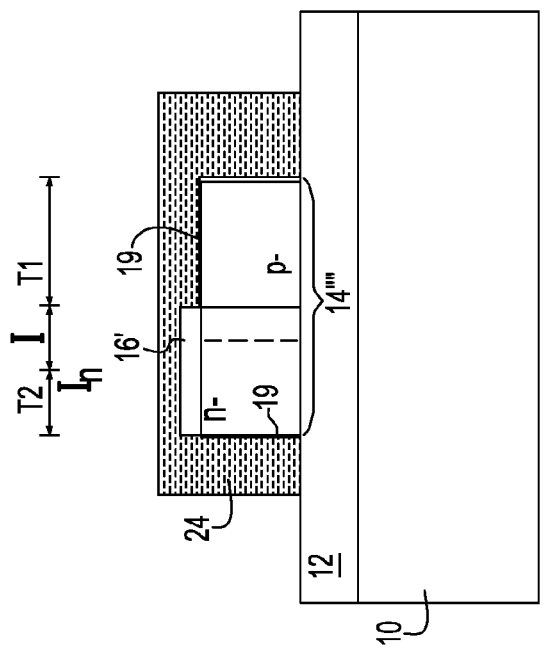
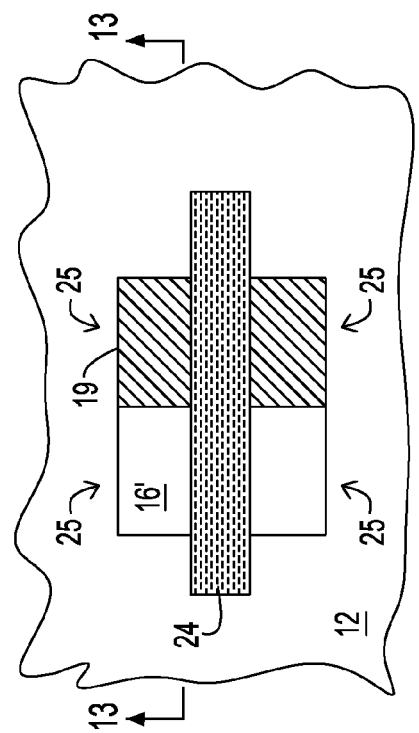

SEMICONDUCTOR STRUCTURES INCORPORATING MULTIPLE CRYSTALLOGRAPHIC PLANES AND METHODS FOR FABRICATION THEREOF

CROSS-REFERENCE TO RELATED APPLICATION

This application is a divisional of U.S. application Ser. No. 11/556,833, filed Nov. 6, 2006.

BACKGROUND

1. Field of the Invention

The invention relates generally to semiconductor structures. More particularly, the invention relates to semiconductor structures with enhanced performance.

2. Description of the Related Art

As semiconductor technology advances, dimensions of semiconductor devices and semiconductor structures continue to decrease. As a result of this continued scaling of semiconductor device and structure dimensions, it has become increasingly important within semiconductor technology to fabricate semiconductor devices with increasingly enhanced performance at continued decreased dimensions.

An additional trend within semiconductor technology that also provides enhanced semiconductor device performance is the fabrication of semiconductor devices upon different crystallographic orientation semiconductor substrates. Generally, particular crystallographic orientations are selected to optimize either electron mobility or hole mobility. For example, nFET devices are desirably fabricated upon {100} crystallographic planes on silicon-containing semiconductor substrates to provide enhanced electron mobility, while pFET devices are desirable fabricated upon {110} crystallographic planes on silicon-containing semiconductor substrates to provide enhanced hole mobility.

Examples of semiconductor structures fabricated using multiple crystallographic orientation substrates are known in the art.

Semiconductor device dimensions are certain to continue to decrease, and as a result thereof it is desirable to fabricate semiconductor devices with enhanced performance at decreased dimensions. To that end, additional semiconductor structures that obtain advantage through use of multiple crystallographic orientation semiconductor substrates are desirable.

SUMMARY OF THE INVENTION

The invention provides semiconductor structures having multiple crystallographic orientations and methods for fabrication thereof. As well, the invention also provides a semiconductor circuit incorporating such a semiconductor structure.

A semiconductor structure in accordance with the invention comprises an isolating substrate having a semiconductor mesa located thereupon. The semiconductor mesa comprises a first end including a first doped region separated from a second end including a second doped region different from the first doped region by an isolating region interposed therebetween. The semiconductor structure also includes a first device located using a sidewall surface and a top surface of the first end as a first channel region. The semiconductor structure also includes a second device located using a sidewall surface and not a top surface of the second end as a second channel region. Within the semiconductor structure, the first device benefits from a horizontal top surface crystallographic orientation of the semiconductor mesa and the second device benefits from a vertical sidewall surface crystallographic orientation of the semiconductor mesa.

A semiconductor circuit in accordance with the invention incorporates therein a semiconductor structure in accordance with the invention.

A method in accordance with the invention includes forming a semiconductor mesa upon an isolating substrate. The method provides that the semiconductor mesa comprises a first end including first doped region separated from a second end comprising a second doped region different from the first doped region by an isolating region located interposed therebetween. The method in accordance with the invention also includes forming a first device located using a sidewall surface and a top surface of the first end as a first channel region. The method in accordance with the invention also includes forming a second device located using a sidewall surface and not a top surface of the second end as a second channel region. The method provides that the first device benefits from a horizontal top surface crystallographic orientation of the semiconductor mesa and the second device benefits from a vertical sidewall surface crystallographic orientation of the semiconductor mesa.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein:

FIG. 1 to FIG. 14 show a series of schematic cross-sectional and plan-view diagrams illustrating the results of progressive stages in fabricating a semiconductor structure in accordance with an embodiment of the invention.

FIG. 15 to FIG. 24 show a series of schematic cross-sectional and plan-view diagrams illustrating the results of progressive stages in fabricating a semiconductor structure in accordance with another embodiment of the invention.

DESCRIPTION OF THE PREFERRED EMBODIMENT

The invention, which includes semiconductor structures and methods for fabricating semiconductor structures, as well as a semiconductor circuit incorporating the semiconductor structures, is described in greater detail below within the context of the drawings described above. Since the drawings are for illustrative purposes only, they are not necessarily drawn to scale.

By reference to FIG. 1 to FIG. 14, shown is a series of schematic cross-sectional diagrams of a semiconductor structure in accordance with an embodiment of the invention. This embodiment of the invention comprises a first embodiment of the invention. Shown in FIG. 1 is a schematic cross-sectional diagram of the semiconductor structure at an early stage in the fabrication thereof in accordance with this embodiment.

Figure 1:
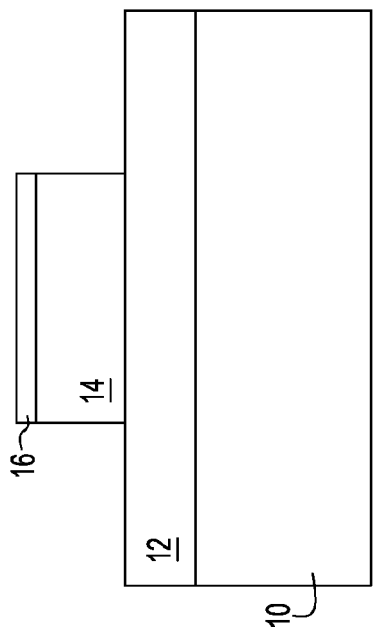

FIG. 1 shows a substrate 10. An isolation layer 12 is located upon the substrate 10. A semiconductor mesa 14 is located upon the isolation layer 12. A channel stop dielectric layer 16 is located upon semiconductor mesa 14.

Each of the foregoing substrate 10 and layers 12/14/16 may comprise materials and have dimensions conventional in the semiconductor fabrication art. Each of the foregoing substrate 10 and layers 12/14/16 may be formed using methods that are conventional in the semiconductor fabrication art.

The substrate 10 may comprise a conductor material, a semiconductor material or a dielectric material, although semiconductor materials are most common. Non-limiting examples of semiconductor materials which may comprise the substrate 10 include silicon, geranium, silicon-germanium alloy, silicon carbide, silicon-germanium carbide alloy, and compound semiconductor materials. Non-limiting examples of compound semiconductor materials include gallium arsenide, indium arsenide and indium phosphide semiconductor materials.

The isolation layer 12 comprises an isolation material. Non-limiting examples of isolation materials include dielectric isolation materials and semiconductor isolation materials. Semiconductor isolation materials function as a result of diode isolation. Dielectric isolation materials are generally more common. Dielectric isolation materials may include, but are not limited to oxides, nitrides and oxynitrides of silicon. Oxides, nitrides and oxynitrides of other elements are not excluded. The dielectric isolation materials may be formed using any of several methods. Non-limiting examples include thermal or plasma oxidation or nitridation methods, chemical vapor deposition methods, physical vapor deposition methods, and ion implantation of oxygen followed by high-temperature annealing. Typically, the isolation layer 12 comprises a silicon-containing dielectric isolation material having a thickness from about 2 nm to about 200 nm.

As an alternative noted above, the isolation layer 12 may also comprise junction isolation materials. Under such circumstances, where the substrate 10 comprises a semiconductor substrate, the isolation layer 12 may in an alternative of a dielectric isolation material comprise an epitaxially deposited junction isolation material, such as a boron-doped or arsenic-doped silicon-germanium alloy junction isolation material. Alternative semiconductor junction isolation materials are also contemplated in accordance with the above semiconductor materials that may comprise the substrate 10.

The semiconductor mesa 14 may comprise any of the several semiconductor materials that may also comprise the substrate 10. Typically, the semiconductor mesa 14 comprises a silicon or silicon-germanium alloy semiconductor material. Typically, the semiconductor mesa 14 has a thickness from about 100 nm to about 100 nm, and a linewidth (in both directions) from about 5 nm to about 200 nm. The semiconductor mesa 14 has a horizontal top surface crystallographic orientation and a vertical sidewall surface crystallographic orientation. The horizontal top surface crystallographic orientation may comprise a {100} oriented plane and the vertical sidewall crystallographic orientation may comprise a {110} oriented plane. Furthermore, the final structure will be configured so as to direct FET channel current that is in the {100} oriented plane in a <110> direction within the {110} plane; hole mobility in such {110} planes is highly anisotropic and benefits most when the current in the plane is directed along a <110> direction. As will be illustrated within the context of further description below, a first transistor (i.e., typically an nFET) is eventually located within a right hand top and sidewall portion of the semiconductor mesa 14 and a second transistor (i.e., typically a pFET) is located using only the left hand sidewall of the semiconductor mesa 14 and not a top surface thereof. The embodiment and the invention also contemplate alternative horizontal and vertical crystallographic orientations for the semiconductor mesa 14. Suitable crystallographic orientations are readily discerned by a person skilled in the art. Particular orientations are selected so that an nFET may be advantaged with one of a vertical and horizontal crystallographic orientation of the semiconductor mesa 14 and a pFET may be advantaged with the other of the vertical and horizontal crystallographic orientation of the semiconductor mesa 14. Such advantage is typically realized within the context of a enhanced electron mobility or hole mobility within appropriate portions of the semiconductor mesa 14.

The channel stop dielectric layer 16 may comprise any of several dielectric materials. Non-limiting examples included the same dielectric materials that may comprise the isolation layer 12, when the isolation layer 12 comprises a dielectric material. Typically, the channel stop dielectric layer 16 comprises silicon containing dielectric material such as silicon dioxide, or a laminate of silicon containing dielectric material. Typically, the channel stop dielectric layer has a thickness from about 2 nm to about 50 nm.

Figure 2:
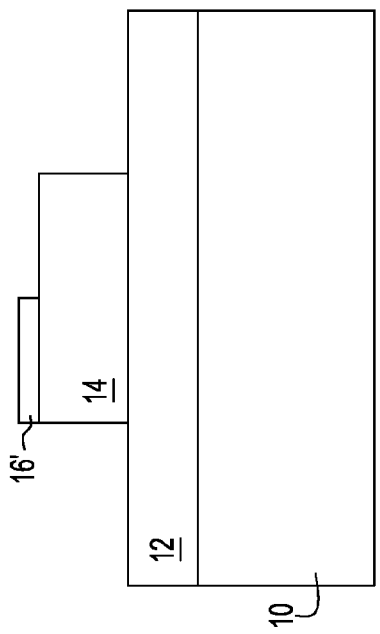

FIG. 2 shows a channel stop dielectric layer 16' located upon the semiconductor mesa 14. Channel stop dielectric layer 16' results from patterning the channel stop dielectric layer 16. The channel stop dielectric layer 16 may be patterned to form the channel stop dielectric layer 16' while using photolithographic methods that are conventional in the semiconductor fabrication art. Typically, the channel stop dielectric layer 16 is patterned to form the channel stop dielectric layer 16' that exposes approximately half of the surface of the semiconductor mesa 14.

Figure 3:
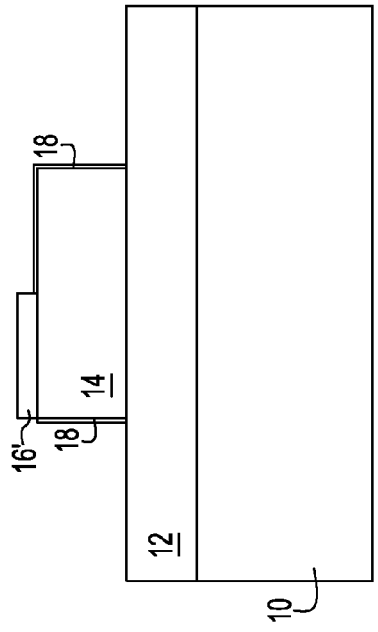

FIG. 3 shows a sacrificial silicon dioxide layer 18 located upon portions of the semiconductor mesa 14. This layer 18 may be grown on silicon surfaces other than those covered by the channel stop dielectric layer 16', in the case where layer 16 is impervious to oxygen ions during the sacrificial oxidation process. The sacrificial layer 18 may comprise silicon dioxide formed by thermal oxidation of silicon surfaces. The sacrificial layer 18 may be formed using any of several methods. Included are thermal or plasma oxidation or oxy-nitridation methods. Typically, the sacrificial layer 18 comprises a thermal silicon oxide material that has a thickness from about 1 nm to about 5 nm.

Figure 4:
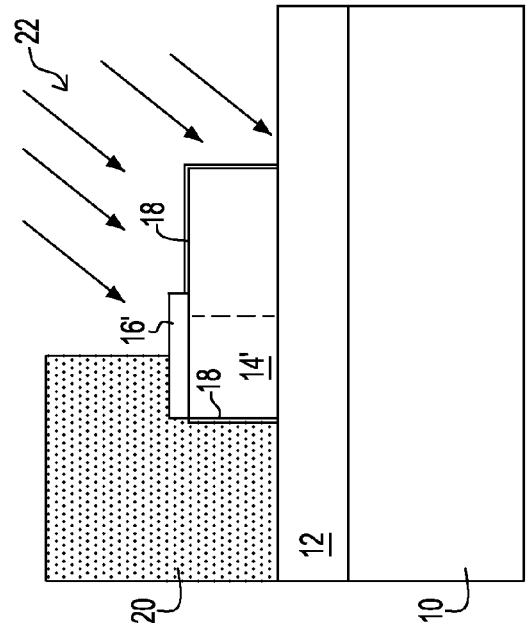

FIG. 4 first shows a mask layer 20 that masks a left sidewall and top portion of the semiconductor mesa 14 that is illustrated in FIG. 3. The mask layer 20 typically comprises a photoresist mask material, but the invention is not necessarily limited to a mask layer formed of only a photoresist mask material. Non-limiting examples of photoresist materials include positive photoresist materials, negative photoresist materials and hybrid photoresist materials. Typically, the mask layer 20 has a thickness from about 0.2 microns to about 1 micron when the mask layer 20 comprises a photoresist mask material. A photoresist material that comprises a photoresist mask layer 20 may be deposited using methods that are conventional in the semiconductor fabrication art. Included are spin coating methods and photolithographic methods that are conventional in the semiconductor fabrication art.

FIG. 4 also shows the results of ion implanting the right top surface and sidewall surface of the semiconductor mesa 14 that is illustrated in FIG. 3 to form lightly p-doped region to the right of the dashed line that bisects the semiconductor mesa 14'. The ion implanting is effected with a dose of first dopant ions 22 that has a first polarity, employing typically boron or gallium or indium. Typically, the dose of first dopant ions 22 provides a dopant concentration within the semiconductor mesa 14' of from about 1e18 to about 1e19 dopant atoms per cubic centimeter. The dose of first dopant ions 22 is intended to dope the semiconductor mesa 14' in a fashion that provides a p-well or p-type body for the channel region for a first transistor that uses the top surface and right sidewall of the semiconductor mesa 14' as a channel region.

Figure 5:
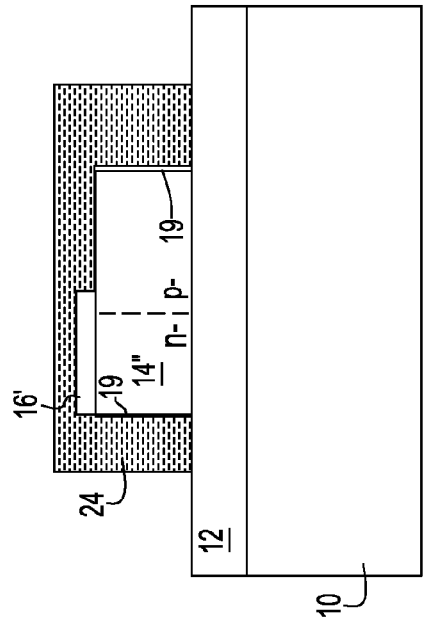

FIG. 5 first shows the results of stripping the mask layer 20 from the semiconductor structure of FIG. 4. The mask layer 20 may be stripped using methods and materials that are conventional in the semiconductor fabrication art. Included are wet chemical stripping methods and dry plasma stripping methods. Aggregates of both methods may also be used.

FIG. 5 also shows a mask layer 20' that masks right sidewall and top portions of the semiconductor mesa 14' that illustrated in FIG. 4. The mask layer 20' that is illustrated within the schematic cross-sectional diagram of FIG. 5 is generally analogous or equivalent with the mask layer 20 that illustrated in FIG. 4 with respect to dimensions and materials of composition. However, the mask layer 22' is located to cover the right top and sidewall portions of the semiconductor mesa 14' rather than the left top and sidewall portions of the semiconductor mesa 14'.

FIG. 5 also shows second dopant ions 23 that are used for implanting left top and sidewall portions of the semiconductor, mesa 14' that is illustrated in FIG. 4 to form n-well or n-doped region of semiconductor mesa 14". The second dopant ions 23 are provided at a dose and ion implant conditions largely similar to the dose of first dopant ions 22 that is illustrated in FIG. 4, except that donor species are employed, such as arsenic, phosphorus or antimony. Thus, the dose of second dopant ions 23 has a second polarity that is different from the first polarity of the first dopant ions 22.

Figure 6:
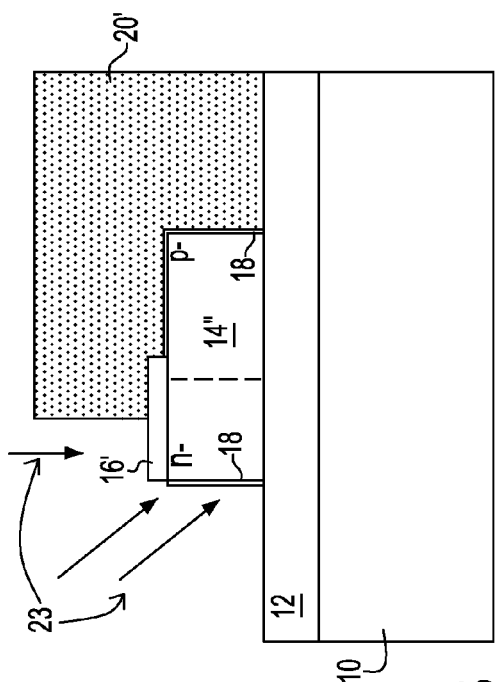

FIG. 6 first shows the results of stripping the mask layer 20' from the semiconductor structure whose schematic cross-sectional diagram is illustrated in FIG. 5. The mask layer 20' may be stripped using methods and materials that are conventional in the semiconductor fabrication art. Included but not limiting are wet chemical striping methods and dry plasma stripping methods.

FIG. 6 also shows the results of stripping the sacrificial layer 18 from exposed portions of the semiconductor mesa 14". The sacrificial layer 18 may be stripped using methods and materials that are also conventional in the semiconductor fabrication art. The sacrificial mask layer 18 generally is stripped using some form of hydrofluoric acid etchant.

FIG. 6 finally shows gate dielectric 19 located upon exposed portions of the semiconductor mesa 14" from which are stripped the sacrificial mask layer 18.

Gate dielectric 19 may comprise any of several gate dielectric materials. Included are generally conventional gate dielectric materials having a dielectric constant from about 3.7 to about 20. These gate dielectric materials may include, but are not limited to, oxides, nitrides and oxynitrides of silicon. Also included are generally higher dielectric constant gate dielectric materials having a dielectric constant from about 7 to at least about 100. These higher dielectric constant gate dielectric materials may include, but are not limited to: hafnium oxides, hafnium silicates, titanium oxides, aluminum oxides, lanthanum oxides, barium-strontium-titantates (BSTs) and lead-zircontate-titantates (PZTs). The gate dielectric 19 may be formed using any of several methods. Non-limiting examples include thermal or plasma oxidation or nitridation methods, chemical vapor deposition methods (including atomic layer chemical vapor deposition methods) and physical vapor deposition methods (including sputtering methods). Typically, the gate dielectric 19 comprises a thermal silicon oxide material that has a thickness from about 10 to about 70 angstroms.

Figure 7:
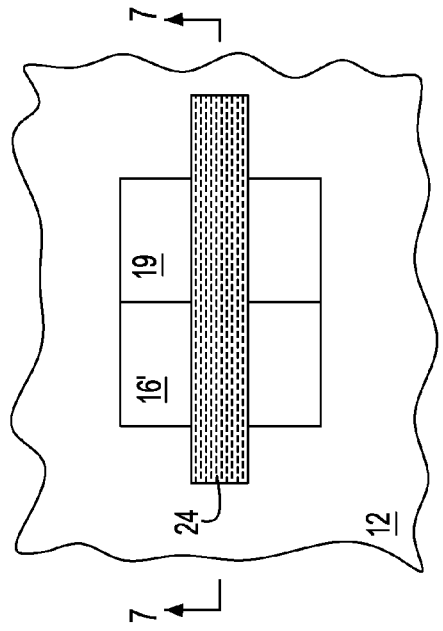

FIG. 7 shows a gate electrode 24 located upon the semiconductor structure of FIG. 6 and in particular spanning top and sidewall surfaces of the semiconductor mesa 14". The gate electrode 24 may comprise any of several gate electrode materials. Non-limiting examples include certain metals, metal alloys, metal silicides and metal nitrides. Also included are doped polysilicon gate materials and polycide gate materials. The gate electrode materials may be deposited using any of several methods that are appropriate to the materials of composition of the gate electrode 24. Non-limiting examples of methods include plating methods, chemical vapor deposition methods and physical vapor deposition methods. Typically, the gate electrode 24 has a thickness from about 50 nm to about 200 nm over the semiconductor mesa 14".

Figure 8:
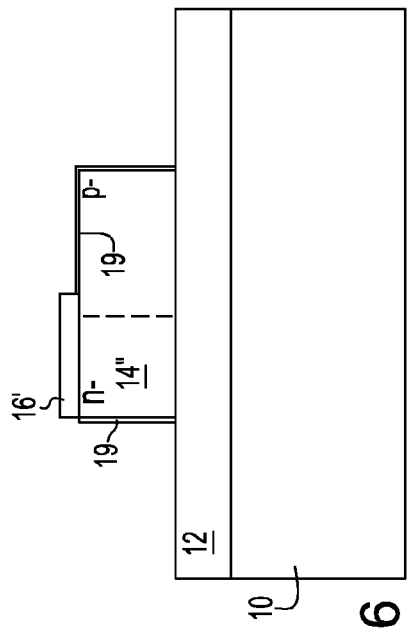

FIG. 8 shows a schematic plan-view diagram corresponding with the schematic cross-sectional diagram of FIG. 7.

FIG. 8 shows the isolation layer 12. Channel stop dielectric layer 16' is located upon a portion of semiconductor mesa 14" which is not otherwise specifically illustrated. Gate dielectric layer 19 is located upon another portion of the semiconductor mesa 14", which again is not specifically illustrated. Gate electrode 24 spans the semiconductor mesa 14" upon which is located the channel stop dielectric layer 16' and the gate dielectric 19.

Figure 9:
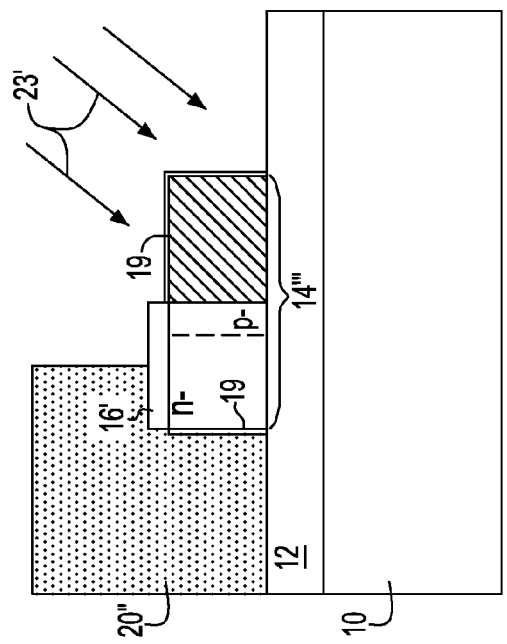
Figure 10:
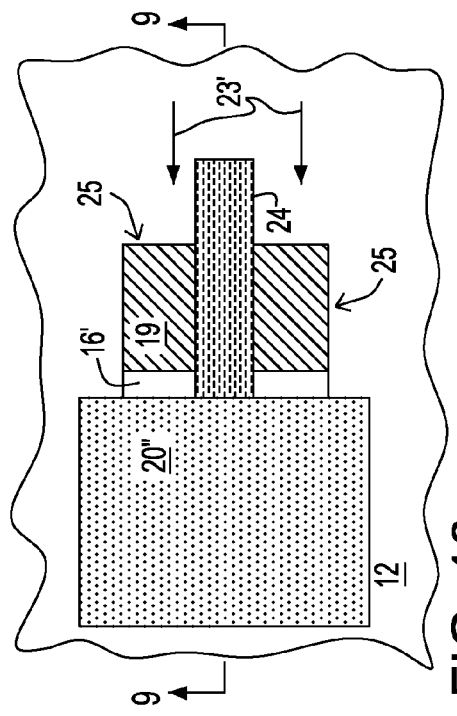

FIG. 9 and FIG. 10 show schematic cross-sectional and schematic plan-view diagrams illustrating the results of further processing of the semiconductor structure of FIG. 7 and FIG. 8.

FIG. 9 and FIG. 10 first show masking layer 20'" located covering left top and sidewall portions of the semiconductor mesa 14' that is illustrated in FIG. 8. Masking layer 20'" is otherwise generally analogous or equivalent to the masking layer 20 that is illustrated in FIG. 4. FIG. 9 and FIG. 10 also show a dose of third dopant ions 23' which is used for forming source/drain regions 25 within exposed portions of a resulting semiconductor mesa 14'" adjoining the gate 24. The dose of third dopant ions 23' uses the same dopant polarity as the second dopant ions 23, although not necessarily the same chemical composition of dopant. Typical third dopant 23' concentrations for the source/drain regions 25 are from about 1e19 to about 1e21 dopant atoms per cubic centimeter, sufficient to dope the exposed regions to a level of degeneracy.

Figure 11:
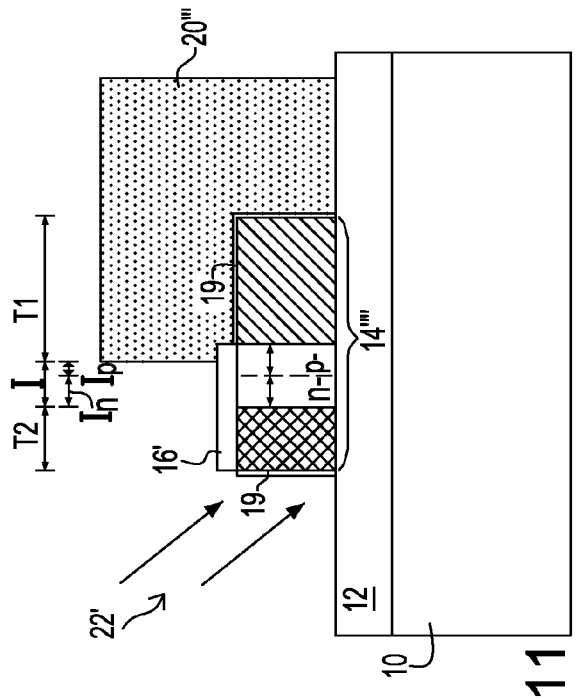
Figure 12:
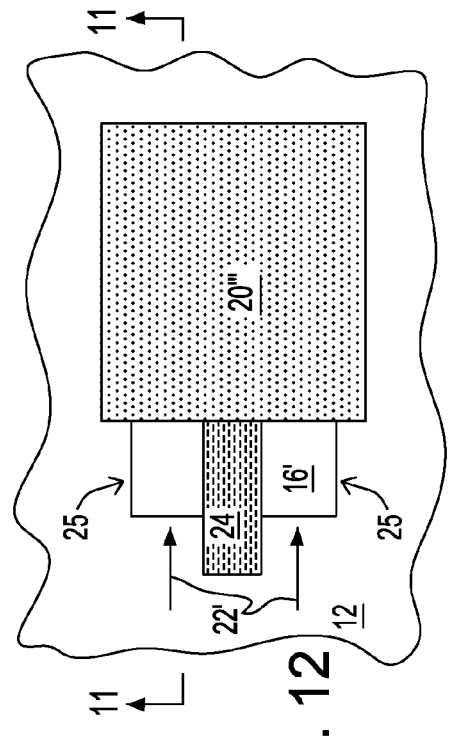

FIG. 11 and FIG. 12 show schematic cross-sectional and schematic plan-view diagrams illustrating the results of further processing of the semiconductor structure of FIG. 9 and FIG. 10.

FIG. 11 and FIG. 12 first show the results of stripping the mask layer 20'" from the semiconductor structure of FIG. 9 and FIG. 10. The mask layer 20'" may be stripped using methods and materials analogous, equivalent or identical to the methods and materials used for stripping foregoing mask layers 20 and 20', as disclosed above.

FIG. 11 and FIG. 12 also show the results of implanting source/drain regions 25 into the left hand side of the semiconductor mesa 14'" that is illustrated in FIG. 9 and FIG. 10 to provide semiconductor mesa 14'". The ion implanting uses a dose of fourth dopant ions 22' that has the same first polarity, but not necessarily the same chemical composition, as the dose of first dopant ions 22. The dose of fourth dopant ions 22' provides an additional pair of source/drain regions 25 into the semiconductor mesa 14"". This pair of source/drain regions 25 typically also has a dopant concentration from about 1e19 to about 1e21 dopant atoms per cubic centimeter. The energy of implantation is chosen to sufficiently low that the ions are unable to penetrate channel stop layer 16'.

As is illustrated within the schematic cross-sectional diagram of FIG. 11, resulting from the dose of fourth dopant ions 22' is the semiconductor mesa 14"" that includes a first transistor T1 region that uses a right top and sidewall of the semiconductor mesa 14'''' as a channel and a second transistor T2 region that uses only a left sidewall of the semiconductor mesa 14'''' as a channel, and not a left top surface. The first transistor T1 region and the second transistor T2 region are separated by an isolation region I, which further comprises an n-well In/p-well Ip junction that yields junction isolation between the first transistor T1 region and the second transistor T2 region. These n-well In and p-well Ip regions may be contacted by conventional means (not shown) to further improve electrical isolation When the semiconductor mesa has a {100} horizontal top surface crystallographic orientation and a {110} vertical sidewall surface crystallographic orientation, the first transistor T1 is typically an nFET and the second transistor T2 is typically a pFET. Polarities of the first, second, third and fourth dopant ions 22, 23, 23' and 22' are selected accordingly, as described above.

FIG. 13 and FIG. 14 show the results of further processing of the semiconductor structure of FIG. 11 and FIG. 12.

FIG. 13 and FIG. 14 show the results of stripping the mask layer 20''' from the semiconductor structure of FIG. 11 and FIG. 12 to provide a finished semiconductor structure.

The finished semiconductor structure comprises a substrate 10. An isolation layer 12 is located upon the substrate 10. A semiconductor mesa 14'''' is located upon the isolation layer 12. A channel stop dielectric layer 16' covers a portion of the semiconductor mesa 14''''. Gate dielectric 19 covers other exposed portions of the semiconductor mesa 14'''' and gate electrode 24 covers a central portion of the semiconductor mesa 14'''' leaving exposed source/drain region 25 portions of the semiconductor mesa 14''''.

The finished semiconductor structure of FIG. 14 thus comprises a semiconductor mesa 14'''' having a top surface crystallographic orientation and a sidewall surface crystallographic orientation different than the top surface crystallographic orientation. A second end (i.e., left hand) portion of the semiconductor mesa 14'''' uses only a sidewall as a channel for forming a semiconductor device that comprises a field effect transistor T2. A first end portion of the semiconductor mesa 14'''' uses both a top surface and a sidewall surface of the semiconductor mesa 14'''' for forming a semiconductor device that comprises a field effect transistor T1. The transistor T1 and the transistor T2 are separated by an isolation region I portion of the semiconductor mesa 14'''' which is sufficiently doped (i.e., from about 1E18 to about 1E19dopant atoms per cubic centimeter) forming a p-well Ip/n-well In junction to provide isolation between the first transistor T1 and the second transistor T2.

FIG. 15 to FIG. 24 show a series of schematic cross-sectional diagrams illustrating the results of progressive stages in fabricating a semiconductor structure in accordance with another embodiment of the invention. This other embodiment of the invention comprises a second embodiment of the invention.

FIG. 15 shows a schematic cross-sectional diagram of the semiconductor structure at an early stage in the fabrication thereof in accordance with this other embodiment of the invention.

FIG. 15 again shows the substrate 10. The isolation layer 12 is located upon the substrate 10. Semiconductor layers 14a and 14b are located upon the isolation layer 12 and separated by isolation regions 13 that are also located upon the isolation layer 12. Channel stop dielectric layers 16' are located atop the semiconductor layers 14a and 14b. Like numbered structures and layers within FIG. 10 are numbered analogously or identically with like numbered structures and layers within FIG. 1. Like numbered structures and layers may comprise materials, have dimensions and be formed using methods that are disclosed within the context of the first embodiment.

Within the second embodiment, the channel stop dielectric layers 16' and the underlying semiconductor layers 14a and 14b are typically formed using a photolithographic method that first provides for additional patterning of the semiconductor mesa 14 and overlying channel stop dielectric layer 16 that is illustrated in FIG. 1. A blanket isolation region material layer may then be deposited upon the resulting semiconductor structure and planarized to from isolation regions 13 that are illustrated in FIG. 15.

The isolation regions 13 may comprise any of the several isolation dielectric materials from which is comprised the isolation layer 12 illustrated in FIG. 1.

FIG. 16 first shows mask layer 20'''' located covering a central isolation region 13 interposed between semiconductor layers 14a and 14b, and spanning across to channel stop dielectric layers 16'. Mask layer 20'''', in conjunction with channel stop dielectric layers 16', is used as an etch mask for stripping the two outboard isolation regions 13 from the semiconductor structure that is illustrated in FIG. 15. The two outboard isolation regions 13 may be stripped using methods and materials that are conventional in the semiconductor fabrication art. Non-limiting examples include wet chemical methods and dry plasma methods.

The resulting structure comprising the sandwiched semiconductor layers 14a and 14b, and the isolation region 13, comprises a semiconductor mesa 14 in accordance with the second embodiment of the invention. Also analogously with the semiconductor mesa 14 within the first embodiment, the semiconductor mesa 14 within the second embodiment has a horizontal top surface crystallographic orientation and a vertical sidewall crystallographic orientation. Specific crystallographic orientations for the foregoing surfaces are in accord with the first embodiment as disclosed above.

Figure 17:
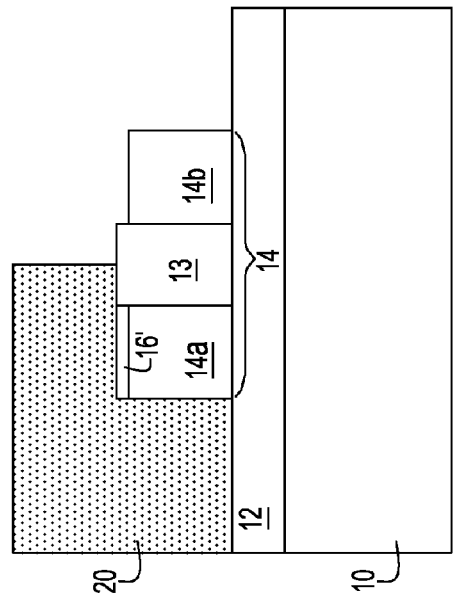

FIG. 17 shows a mask layer 20 located upon a left top and sidewall portion of the semiconductor mesa 14. The mask layer 20 is used as an etch mask for etching one of the channel stop dielectric layers 16' from the semiconductor mesa 14 within the semiconductor structure of structure of FIG. 17. The channel stop dielectric layer 16' is etched using methods and materials that are conventional in the semiconductor fabrication art. The methods and materials will typically use wet chemical etchants, although dry plasma etchants may also be used. Typically, the wet chemical etchants comprise etchant materials that are appropriate to the materials of composition of the channel stop dielectric layers 16'. Dilute or buffered hydrofluoric acid may be used when the channel stop layer is silicon dioxide.

Figure 18:
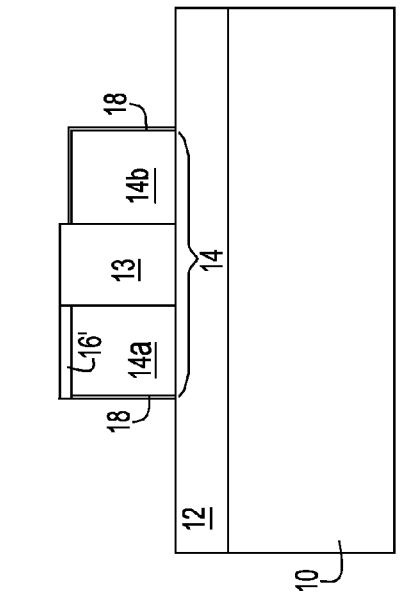

FIG. 18 first shows the results of stripping the mask layer 20 from the semiconductor structure of FIG. 17. The mask layer 20 may be stripped using methods and materials that are conventional in the semiconductor fabrication art. Included are wet chemical stripping methods and dry plasma stripping methods.

FIG. 18 also shows sacrificial layers 18 located upon portions of the semiconductor mesa 14 that are not covered by the channel stop dielectric layer 16' (i.e., sidewall surface of semiconductor layer 14a and top and sidewall portions of semiconductor layer 14b. The sacrificial layers 18 may comprise materials, have dimensions and be formed using methods that are conventional in the semiconductor fabrication art. The sacrificial layers 18 are also analogous or equivalent to the sacrificial mask layers 18 that are illustrated within the first embodiment, and typically comprise silicon dioxide formed by thermal oxidation of exposed silicon surfaces.

Figure 19:
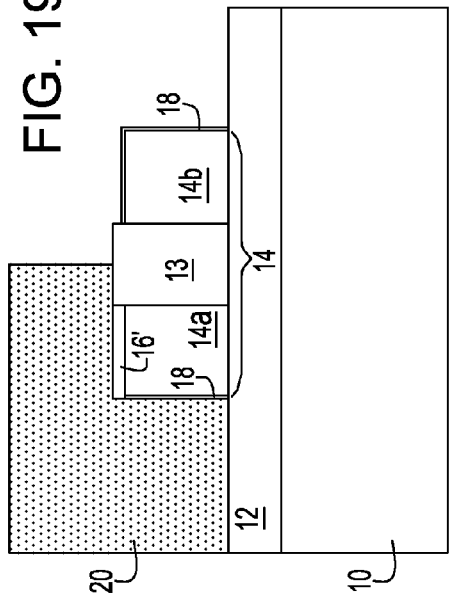

FIG. 19 shows a schematic cross-sectional diagram illustrating the results of further processing of the semiconductor structure of FIG. 18. FIG. 19 first shows mask layer 20 that is located and dimensioned analogously, equivalently or identically to the mask layer 20 that is illustrated in FIG. 17.

FIG. 19 also shows a dose of first dopant ions 22 similar to that illustrated in FIG. 4. The dose of first dopant ions 22 is used for implanting semiconductor layer 14b within the semiconductor mesa 14 that is illustrated in FIG. 18 to provide semiconductor layer 14b' and semiconductor mesa 14' that is illustrated in FIG. 19. Similarly with the first embodiment, the dose of first dopant ions 22 has a first polarity. In this embodiment this dose may be substantially lower than that illustrated in FIG. 4 since isolation region 13 between the mesa regions 14a and 14b serves as electrical isolation, thereby relieving the higher dose concentrations required for the first embodiment.

Figure 20:
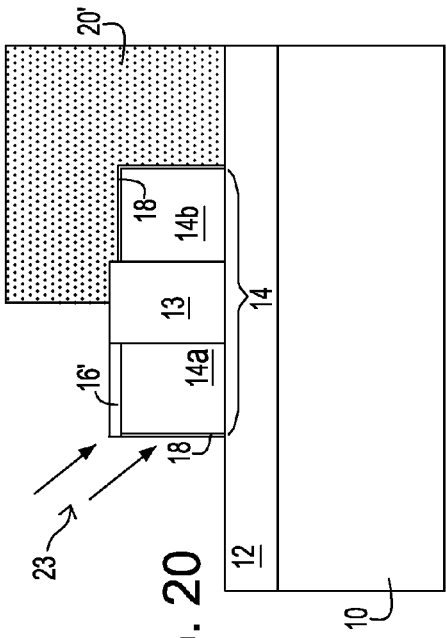

FIG. 20 shows the results of stripping the mask layer 20 that is illustrated in FIG. 19 and in turn forming a mask layer 20' upon the right hand top and side portions of the semiconductor mesa 14'. FIG. 20 also shows the dose of second dopant ions 23 that is used to dope the semiconductor layer 14a within the semiconductor mesa 14' and form semiconductor layer 14a' within a semiconductor mesa 14". The dose of second dopant ions 23 (which has a second polarity different from the first polarity) is otherwise similar to the dose of second dopant ions 23 within the first embodiment, as illustrated in FIG. 5. In this embodiment this dose may be substantially lower than that illustrated in FIG. 5 since isolation region 13 between the mesa regions 14a and 14b serves as electrical isolation, thereby relieving the higher dose concentrations required for the first embodiment.

It is further noted that the steps of FIGS. 19-20 are optional for this embodiment, as halo ion implants (to be performed after gate formation) can be used to set the FET electrical characteristics and the well dopings of the first embodiment are not required for inter-device isolation.

Figure 21:
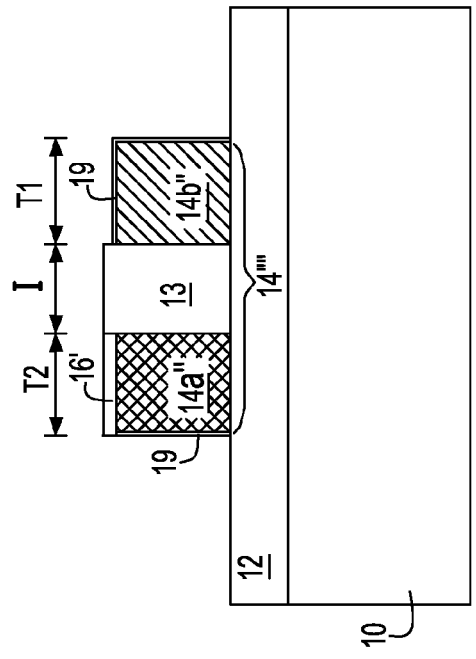

FIG. 21 first shows the results of stripping the sacrificial layer 18 from the semiconductor layers 14a' and 14b' within the semiconductor mesa 14". The sacrificial layer 18 may be stripped using methods and materials analogous or equivalent to the methods and materials used for stripping the sacrificial layer 18 that is illustrated within the first embodiment.

FIG. 21 also shows the results of forming gate dielectric 19 generally replacing sacrificial layer 18. The gate dielectric 19 may comprise materials, have dimensions and be formed using methods disclosed above within the context of the first embodiment.

Figure 22:
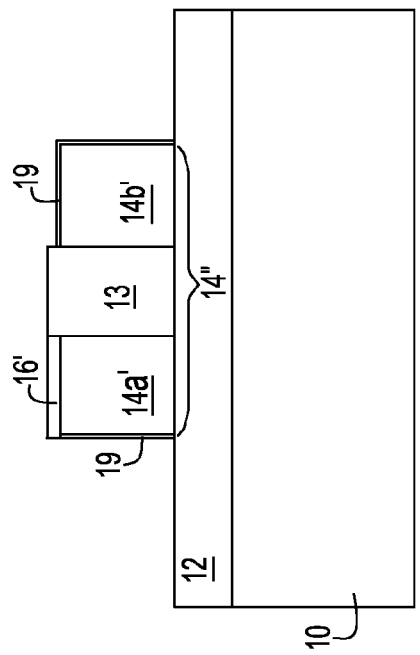

FIG. 22 shows a gate electrode 24 located upon the semiconductor structure of FIG. 21 while spanning the semiconductor mesa 14". The gate electrode 24 is analogous, equivalent or identical to the gate electrode 24 disclosed above within the context of the first embodiment.

Figure 23:
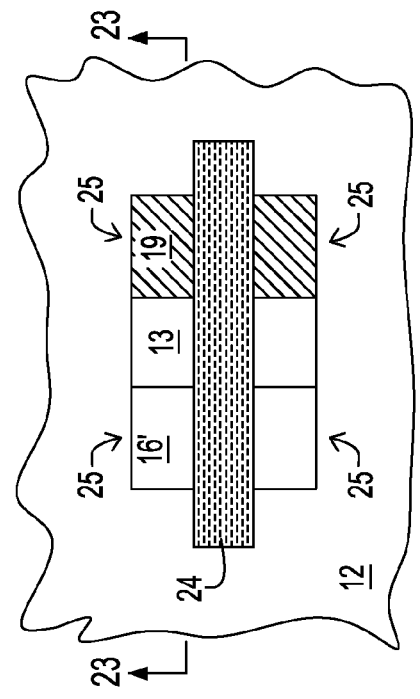
Figure 24:
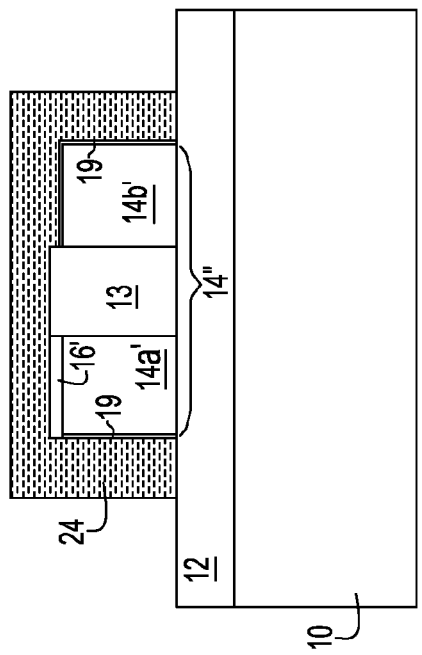

FIG. 23 and FIG. 24 show a schematic cross-section and schematic plan-view diagram that illustrate the results of forming source/drain regions 25 into a semiconductor mesa 14"". The source/drain regions 25 are formed using separate ion implantation process steps in accordance with the first embodiment of the invention as disclosed above, and illustrated within the context of FIG. 9 to FIG. 12. As discussed earlier, formation of the source and drain regions may further comprise ion implantation of halo impurities to adjust the FET threshold voltages and other electrical properties.

As a result of forming the source/drain regions 25, a first transistor T1 region and a second transistor T2 region are located and formed within a semiconductor mesa 14"". The first transistor region T1 and the second transistor region T2 are separated by an isolation region I portion of the semiconductor mesa 14"". The isolation region portion of the semiconductor mesa 14"" comprises isolation region 13.

FIG. 23 and FIG. 24 show a pair of schematic cross-sectional and plan-view diagrams illustrating a semiconductor structure in accordance with a second embodiment of the invention. The semiconductor structure comprises a semiconductor mesa 14"" having a first transistor region T1 separated from a second transistor region T2 by an isolation region I that comprises an isolation region 13. The first transistor T1 region uses a top surface and a sidewall surface of the semiconductor mesa 14"" as a channel region. The second transistor T2 region uses only a sidewall surface of the semiconductor mesa 14"" a channel region.

Similarly with the first embodiment, the second embodiment also provides a semiconductor structure comprising a first transistor T1 and a second transistor T2 having separate crystallographic orientation channel regions that may be advantaged within the context of electron and hole mobility enhancements.

Figure 25:
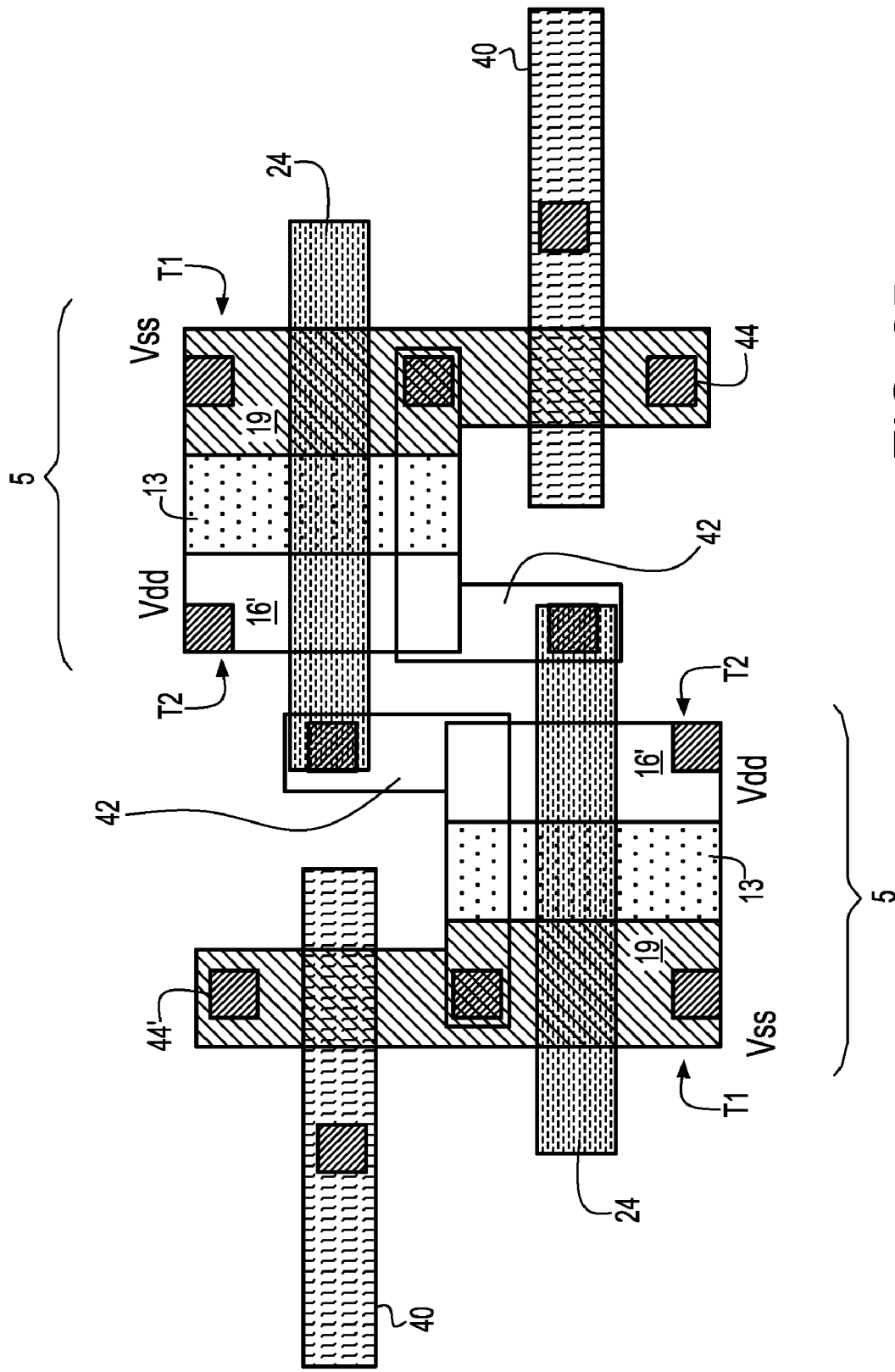
FIG. 25 shows a schematic plan-view diagram illustrating a semiconductor circuit layout into which may be incorporated semiconductor structures in accordance with the embodiments.

FIG. 25 shows a schematic layout diagram illustrating a semiconductor circuit that incorporates a semiconductor structure S in accordance with the foregoing embodiments, and in particular the second embodiment.

The schematic layout diagram illustrates a six transistor static random access memory (SRAM) cell. Structure S is in accordance with the foregoing embodiments, with gate electrode 24 illustrated for reference purposes. Structure S corresponds more directly with the schematic plan view of FIG. 24, with transistor T1 and transistor T2 appropriately designated. Gate dielectric 19, channel stop dielectric layer 16' and isolation region 13 are in particular illustrated. Source sides (i.e., Vss, T1) of structure S are laterally elongated to provide pass gate nFET devices that include word lines 40. Vss portions of the base unelongated portions of the structures S comprise pull-down nFET devices as T1 devices. The pull-down nFET devices use top surface and sidewalls as channel regions. Vdd portions of the structures comprise pull-up pFET devices that use only sidewall channels for the devices. The pull-up pFET devices are T2 devices. Interconnects 42 interconnect the devices within the structures S. Bit line true 44 and bit-line complement 44' are also designated.

The preferred embodiments of the invention are illustrative of the invention rather than limiting of the invention. Revisions and modifications may be made to methods, materials, structures and dimensions in accordance with the preferred embodiments of the invention, while still providing an embodiment in accordance with the invention, further in accordance with the accompanying claims.

What is claimed is:

1. A semiconductor structure comprising:
an isolating substrate having a semiconductor mesa located thereupon, the semiconductor mesa comprising a first end comprising a first doped region separated from a second end comprising a second doped region different from the first doped region by an isolating region interposed therebetween;
a first device located using a sidewall surface and a top surface of the first end as a first channel region; and
a second device located using a sidewall surface and not a top surface of the second end as a second channel region, where the first device benefits from a horizontal top surface crystallographic orientation of the semiconductor mesa and the second device benefits from a vertical sidewall surface crystallographic orientation of the semiconductor mesa.

2. The semiconductor structure of claim 1 wherein said second device is configured to conduct current in said second channel region in a direction that is parallel to said sidewall surface and to said top surface.

3. The semiconductor structure of claim 1 wherein said first device and said second device use a single gate electrode gating said first device and said second device.

4. The semiconductor structure of claim 1 further comprising a channel stop dielectric layer located upon a horizontal top surface of the semiconductor mesa over the second doped region.

5. The semiconductor structure of claim 1 wherein:
   the isolating substrate comprises a semiconductor material;
   the semiconductor mesa comprises one of a silicon material and a silicon-germanium alloy material; and
   the isolating substrate comprises the other of the silicon material and the silicon-germanium alloy material.

6. The semiconductor structure of claim 1 wherein the isolating substrate comprises a dielectric isolating material.

7. The semiconductor structure of claim 1 wherein the isolating region comprises a pn junction in a semiconductor material having a dopant concentration from about 1E18 to about 1E19 dopant atoms per cubic centimeter.

8. The semiconductor structure of claim 1 wherein the isolating region comprises a dielectric isolating material.

9. The semiconductor structure of claim 1 wherein:
   the horizontal top surface crystallographic orientation is a {100} crystallographic plane; and
   the vertical sidewall surface crystallographic orientation is a {110} crystallographic plane.

10. The semiconductor structure of claim 9 wherein the first device comprises an nFET and the second device comprises a pFET.

11. The semiconductor structure of claim 9 wherein the direction of channel current in said second device is in a <110> direction within a {110} plane.

12. The semiconductor structure of claim 1 further comprising a lateral extension of one end of the semiconductor mesa but not the other end of the semiconductor mesa.

13. The semiconductor structure of claim 12 where the lateral extension includes the first end of the semiconductor mesa.

14. A semiconductor circuit comprising the semiconductor structure of claim 1.

15. The semiconductor circuit of claim 14 wherein the semiconductor structure further comprises a lateral extension of one end of the semiconductor mesa.

* * * * *